United States Patent [19]

Williams et al.

[11] Patent Number: 5,374,843
[45] Date of Patent: Dec. 20, 1994

[54] LIGHTLY-DOPED DRAIN MOSFET WITH IMPROVED BREAKDOWN CHARACTERISTICS

[75] Inventors: Richard K. Williams, Cupertino; Michael E. Cornell, Campbell; Mike Chang, Cupertino; David Grasso, San Jose; Agnes Yeung, Saratoga; Juiping Chuang, Cupertino, all of Calif.

[73] Assignee: Siliconix, Inc., Santa Clara, Calif.

[21] Appl. No.: 40,684

[22] Filed: Mar. 31, 1993

Related U.S. Application Data

[63] Continuation-in-part of Ser. No. 697,356, May 6, 1991.

[51] Int. Cl.[5] .................. H01L 29/78; H01L 29/91
[52] U.S. Cl. ........................... 257/492; 257/493; 257/632; 257/335
[58] Field of Search ............... 257/493, 494, 638, 640, 257/645, 646, 335, 603, 492, 632, 335, 336, 339

[56] References Cited

U.S. PATENT DOCUMENTS

| | | | |
|---|---|---|---|
| 4,058,822 | 11/1977 | Awane | 357/23 |
| 4,153,904 | 5/1979 | Tasch | 257/483 |
| 4,292,642 | 9/1981 | Appels | 357/13 |
| 4,297,149 | 10/1981 | Koons | 257/646 |
| 4,300,150 | 11/1981 | Colak | 357/23 |
| 4,399,449 | 8/1983 | Herman | 257/493 |
| 4,509,067 | 4/1985 | Minami | 357/13 |
| 4,580,156 | 4/1986 | Comizzoli | 257/493 |
| 4,652,895 | 3/1987 | Roskos | 357/13 |
| 4,819,045 | 4/1989 | Murakami | 357/23.4 |
| 4,884,116 | 11/1989 | Shirai | 357/23.4 |
| 4,890,146 | 12/1989 | Williams | 357/23.4 |
| 4,922,327 | 5/1990 | Mena | 357/23.4 |
| 4,929,991 | 5/1990 | Blanchard | 257/335 |
| 4,933,740 | 6/1990 | Baliga | 357/23.4 |
| 4,939,566 | 7/1990 | Singer | 357/23.4 |
| 5,055,896 | 10/1991 | Williams | 257/409 |
| 5,057,897 | 10/1991 | Nariani et al. | 257/645 |
| 5,077,590 | 12/1991 | Fujihira | 257/603 |
| 5,107,323 | 4/1992 | Knolle | 257/646 |

FOREIGN PATENT DOCUMENTS

| | | | |
|---|---|---|---|
| 0095658 | 5/1983 | European Pat. Off. | |
| 114435A1 | 8/1984 | European Pat. Off. | H01L 29/78 |
| 3806164A1 | 2/1988 | Germany | |
| 55-52272 | 4/1980 | Japan | 357/23.4 |
| 56-070662 | 6/1981 | Japan | H01L 29/78 |
| 5720476 | 2/1982 | Japan | 257/603 |
| 57-211778 | 12/1982 | Japan | |
| 58-140165 | 8/1983 | Japan | H01L 29/78 |
| 62-45175 | 2/1987 | Japan | 357/23.4 |
| 62-222676 | 9/1987 | Japan | H01L 29/78 |
| 1-243472 | 9/1989 | Japan | 357/23.4 |
| 2051274 | 2/1990 | Japan | |
| 2-102577 | 4/1990 | Japan | 357/23.8 |
| 3057278 | 3/1991 | Japan | H01L 29/784 |

OTHER PUBLICATIONS

Knolle, et al., U.S. Statutory Invention Registration No. H665, Pub. Date: Aug. 1, 1989.

Primary Examiner—Rolf Hille
Assistant Examiner—Wael M. Fahmy
Attorney, Agent, or Firm—Skjerven, Morrill, MacPherson, Franklin & Friel E. J. Wildi et al., "Modeling and Process Implementa- (List continued on next page.)

[57] ABSTRACT

A high voltage integrated circuit (IC) has a passivation structure that shields the underlying circuit from the electrical effects of charge on the passivation structure. In one embodiment, the passivation structure comprises a silicon rich nitride layer in electrical contact with underlying circuit elements. The silicon rich nitride is highly resistive and permits only a negligible current between elements, but is conductive enough that charge on the surface of the passivation structure flows into the IC before the electric fields in the underlying circuit elements is significantly changed. In another embodiment, the passivation structure has two or more layers with a less conductive layer in contact with the underlying IC and overlying conductive layer which shields the IC from the effects of charge build up.

14 Claims, 16 Drawing Sheets

OTHER PUBLICATIONS tion if Implanted Resurf Type Devices," Proceedings IEDM 1982, pp. 268–271.

S. C. Sun et al., "Modeling of the On-Resistance of LDMOS, VDMOS, and VMOS Power Transistors," IEEE Transactions on Electron Devices, vol. ED-27, No. 2, Feb. 1980, pp. 356–367.

M. Declercq et al, "Avalanche Breakdown in High voltage D-MOS Devices," IEEE Transactions on Electron Devices, vol. ED-23, No. 1, Jan. 1976, pp. 1–4.

B. J. Baliga, "Power Integrated Circuits–A Brief Overview," IEEE Transactions of Electron Devices, vol. ED-33, No. 12, Dec. 1986, pp. 1936–1639.

Appels et al, "High Voltage Thin Layer Devices (Resurf Devices)" IEDM 1979, pp. 238–241.

S. Colak, "Effects of Drift Region Parameters on the Static Properties of Power LDMOST" Transactions on Electron Devices, vol. ED-28, No. 12, Dec. 1981, pp. 1455–1466.

Osenbach, "Semi-Insulating Silicaon . . . " IEEF Trans. on Electron Dev., vol. 17, Jun. 1988.

LIGHTLY-DOPED DRAIN MOSFET WITH IMPROVED BREAKDOWN CHARACTERISTICS

CROSS-REFERENCE TO RELATED APPLICATIONS

This application is a continuation-in-part of U.S. patent application Ser. No. 07/697,356, entitled "Lightly-Doped Drain MOSFET with Improved Breakdown Characteristics", by Richard K. Williams and Michael E. Cornell, filed on the sixth day of May, 1991.

BACKGROUND OF THE INVENTION

1. Field of the Invention

This invention relates to passivation structures overlying metal oxide semiconductor (MOS) devices, and more particularly relates to passivation structures that electrically shield underlying devices, and most particularly relates to silicon rich nitride used as a passivation layer for a lateral double-diffused MOS (DMOS) field effect transistors.

2. Description of the Related Art

Lateral double-diffused metal-oxide-semiconductor (lateral DMOS) transistors of the type having a lightly-doped drain (LDD) region (or "LDD lateral DMOS transistors") are often found in high-voltage integrated circuits. Among these LDD lateral DMOS devices, the self-isolated devices are especially desirable because of their relative ease of integration with low-voltage devices, which are often used to perform logic functions. The self-isolated devices are so described because, for N-channel devices, each transistor's N+ drain and source regions are separated from the N+ drain and source regions of other transistors by the reverse-biased PN-junction formed between each of these drain and source regions and the p-type substrate. Because of self-isolation, the self-isolated DMOS devices occupy less area and are relatively less costly than either the junction-isolated LDD lateral DMOS devices or the dielectric-isolated LDD lateral DMOS devices. An overview of the various types of LDD lateral DMOS devices discussed above can be found in "Power Integrated Circuits—A Brief Overview" by B. Baliga, IEEE Transactions on Electron Devices, Vol. ED-33, No. 12, December 1986, pp.1936-9.

FIG. 1 is a cross section of an N-channel LDD lateral DMOS transistor 100 showing the double-diffused N+ source region 102 and P-body region 103. The P-body and source regions 103 and 102 are commonly connected by conductor 120, which connects the P-body region 103 via the P+ contact region 101. The drain of transistor 100 is formed by the N− LDD or drift region 122 and the N+ contact region 107. Transistor 100 is controlled by the voltage of gate 109, which is situated above the gate oxide 110 and enclosed by insulation layer 121. Optionally, a deep P+ region 104 can be formed to provide a good contact to the P− substrate 105. This deep P+ region 104 does not significantly impact the breakdown voltage of transistor 100, nor increase the parasitic capacitance associated with the transistor 100. An optional N-well 106 can also be formed to provide a "deep" drain region suitable for longer-drift high-voltage devices requiring a higher breakdown voltage. Transistor breakdown often occurs at the high electric field associated with the edge of the drift region 122 next to the N+ contact region 107 ("drain-edge"), if the drift region 122 is very lightly doped. Alternatively, breakdown is more likely to occur at the edge of the drift region 122 next to the gate 109 ("gate-edge"), if the drift region 122 is relatively more heavily doped. A higher dopant dose in the drift region 122 reduces the on-resistance of the transistor 100, thereby allowing a higher saturation current. However, a breakdown at the surface near the gate-edge of drift region 122 may leave an amount of charge in the gate oxide 110, resulting in reliability problems and an unstable breakdown voltage.

FIG. 2 shows the electrical potential distribution when transistor 100 is in the "off" state. (In FIG. 2, the optional deep P+ region 104 and the optional N-well 106 are not shown). As shown in FIG. 2, high electric fields are indicated by the closely-spaced electrical equipotential lines "crowding" at the gate-edge of the drift region 122. The distribution of high electric fields at the gate edge lowers the breakdown voltage of transistor 100.

FIG. 3 illustrates one method in the prior art to relieve the crowding of electrical equipotential lines, and thereby increases the breakdown voltage of transistor 100. As shown in FIG. 3, a conductor 111, called a field plate, which is electrically connected either to the gate 109 or the source region 102 or P body 103, is situated above the gate-edge of the drift region 122. As shown in FIG. 3, the presence of the field plate 111 reduces the crowding of equipotentials at the gate-edge of the drift region 122 above the silicon surface, and hence lowers the electric field intensities at the gate-edge. The field plate 111 can be formed using polysilicon or metal. (When the field plate is electrically connected to the gate 109, the field plate is also known as the "gate plate"). However, there still remains high electric fields at the sidewalls (indicated by arrow A) of the N− drift region 122. Hence, the relief of electrical equipotential crowding using the gate plate approach is not satisfactory, particularly because reasonable and expected process variations in the doping concentration of the N− drift region 122 can exacerbate such field crowding.

Another method to increase breakdown voltage of a LDD lateral DMOS transistor is achieved by the reduced surface field (RESURF) technique, discussed in "High Voltage Thin Layer Devices (RESURF Devices)," by J. Appels et al, International Electron Device Meeting Technical Digest, December 1979, pp. 238-41. The RESURF technique provides the LDD lateral DMOS transistor in a lightly doped N-epitaxial layer on top of a P− substrate. In the RESURF technique, adjacent transistors are junction-isolated by P+ regions.

FIG. 4 shows a junction-isolated RESURF lateral DMOS transistor 200 having a field-shaping P+ buried layer 201. In FIG. 4, transistor 200 is fabricated in an N-epitaxial layer 206 formed on top of the P− substrate 205. Transistor 200 comprises the N+ source and drain regions 202 and 207, the P-body region 203, and gate 209, which is formed above a gate oxide layer 210 and enclosed in the insulator layer 221. The N+ source region 202 and the P-body region 203 are commonly connected by the metallization 220. In addition, transistor 200 is provided a field-shaping buried layer 201, which extends from the P+ isolation 204 and reaches horizontally underneath the gate region beyond the gate-edge of the drift region 222. In FIG. 4, in addition to the increased breakdown voltage due to the RESURF effects, the field-shaping P+ buried layer 201 enhances the breakdown voltage further by "uncrowding" the equipotential lines in the N− epitaxial layer 206 next to the gate region underneath 209. A similar transistor is disclosed in U.S. Pat. No. 4,300,150, entitled "Lateral Double-diffused MOS Transistor Device," by S. Colak, filed Jun. 16, 1980 and issued Nov. 10, 1981.

While RESURF lateral DMOS transistor 200 of FIG. 4 has its breakdown voltage enhanced, due to both the use of the RESURF technique and the field-shaping P+buried layer 201, RESURF lateral DMOS transistor 200 is expensive from the packing density stand point because additional area is required by the P+ isolation region 204. In addition, the P+ isolation region 204 must be appropriately shaped, as shown in FIG. 4, to short the emitter-to-base junction of the high-gain parasitic vertical NPN transistor formed by the N+ source region 202, the P-body region 203, and the epitaxial region 206. Shorting the emitter-to-base junction prevents a phenomenon known as "common-emitter base-open breakdown voltage snap-back" ("$BV_{CEO}$ snap-back"), which can destroy the device. In fabricating the P+ isolation region 204, care must be taken to ensure that the P+ diffusion penetrates the N− epitaxial layer into the P− substrate to ensure complete isolation.

Further, the P-body region 203 of RESURF lateral DMOS transistor 200 of FIG. 4 forms a reversed-bias junction with the N− epitaxial layer 206. Such reversed-biased junction increases the likelihood of punch-through (barrier lowering) breakdown degradation in RESURF lateral DMOS transistor 200. As a result, the ability to integrate other bipolar or high voltage devices may be restricted by design considerations of the RESURF lateral DMOS transistor.

Therefore, a self-isolated LDD lateral DMOS transistor having reduced peak electric field at the gate-edge of the drift region is highly desirable. Such transistor would allow a higher dopant concentration in the drift region without reliability or breakdown voltage degradation. Further, such self-isolated LDD lateral DMOS transistor provides the breakdown voltage and reliability characteristics without incurring the area penalty of the P+ isolation in a RESURF type lateral DMOS transistor, and allows the designer further freedom to select and use thicker epitaxial layers for other purposes, such as for providing a vertical NPN transistor.

SUMMARY OF THE INVENTION

In accordance with a structure and a method of the present invention, a self-isolated LDD lateral DMOS transistor is provided having reduced peak electric fields at the gate edge without the added area cost of a RESURF transistor. The self-isolated LDD lateral DMOS transistor is formed in a lightly-doped epitaxial layer having the same conductivity type as the conductivity types of the substrate, a double-diffused body region and a buried layer. The buried layer extends from a position substantially beneath the source region to a position substantially beneath the drift region.

In one embodiment, a conductive gate plate (which may be metal, doped polysilicon, or any other appropriate conductive material) is provided above the gate region of the self-isolated lateral DMOS transistor. In another embodiment, a deep body diffusion region is provided in the self-isolated DMOS transistor. In another embodiment, a deep drain diffusion region is provided in the self-isolated DMOS transistor. In yet another embodiment, the gate, the buried P+ layer and the drift regions of the self-isolated LDD lateral DMOS transistor form a substantially annular structure surrounding the drain region. In these embodiments, the buried layer, in conjunction with the structure or structures mentioned above, provides field-shaping flexibility to increase the breakdown voltage by relieving electric field crowding.

In another embodiment of the present invention, the drift and the buried P+ regions form a substantially annular structure surrounding the drain region. However, in this embodiment, only one portion of the drift region is bordered by the channel region; another portion of the drift region abuts an "inactive edge" formed by a field oxide layer and the drift region. A P+ buried layer underneath the inactive edge is provided to reduce the electric field intensity at the inactive edge.

In another embodiment of the present invention, a diode is formed by eliminating the active channel region of an LDD lateral DMOS transistor. The P+ buried layer reduces the electric fields at the drift/field oxide interface, and improves the cathode-to-anode reverse-recovery characteristics.

In another embodiment of the present invention, a field oxide region is formed over the drift region prior to formation of the gate. The gate is extended over the field oxide region so as to reduce the electric field intensity at the interface between the channel and the drift regions.

In another embodiment of the invention a silicon rich nitride passivation layer is formed over active regions of an integrated circuit. The silicon rich nitride is in electrical contact with some of the active regions in the circuit, but is highly resistive so that no significant current flows between the active regions through the silicon rich nitride passivation layer. However, charge which reaches the passivation layer drains off the passivation layer through the active elements rather than accumulating. Accordingly, the silicon rich nitride prevents charge build up that changes electric fields in the underlying integrated circuit, and thereby provides a more predictable and constant electric field distribution in the integrated circuit.

In another embodiment the silicon rich nitride passivation layer is combined with a drift region in an integrated circuit element. The silicon rich passivation layer helps shape and reduce the electric field at the edge of the drift region thereby improving breakdown characteristics of the integrated circuit element. The silicon rich passivation layer also reduces variation in the charge build up in the passivation layer and reduces resulting image charge in the drift region. Accordingly, the drift region may be more heavily doped than would otherwise be possible.

The present invention will be better understood upon consideration of the detailed description provided below, in conjunction with the accompanying drawings.

BRIEF DESCRIPTION OF THE DRAWINGS

FIG. 10b is a top view of the self-isolated lateral DMOS transistor 1000 shown in FIG. 10a.

DETAILED DESCRIPTION OF THE PREFERRED EMBODIMENTS

Figure 5:
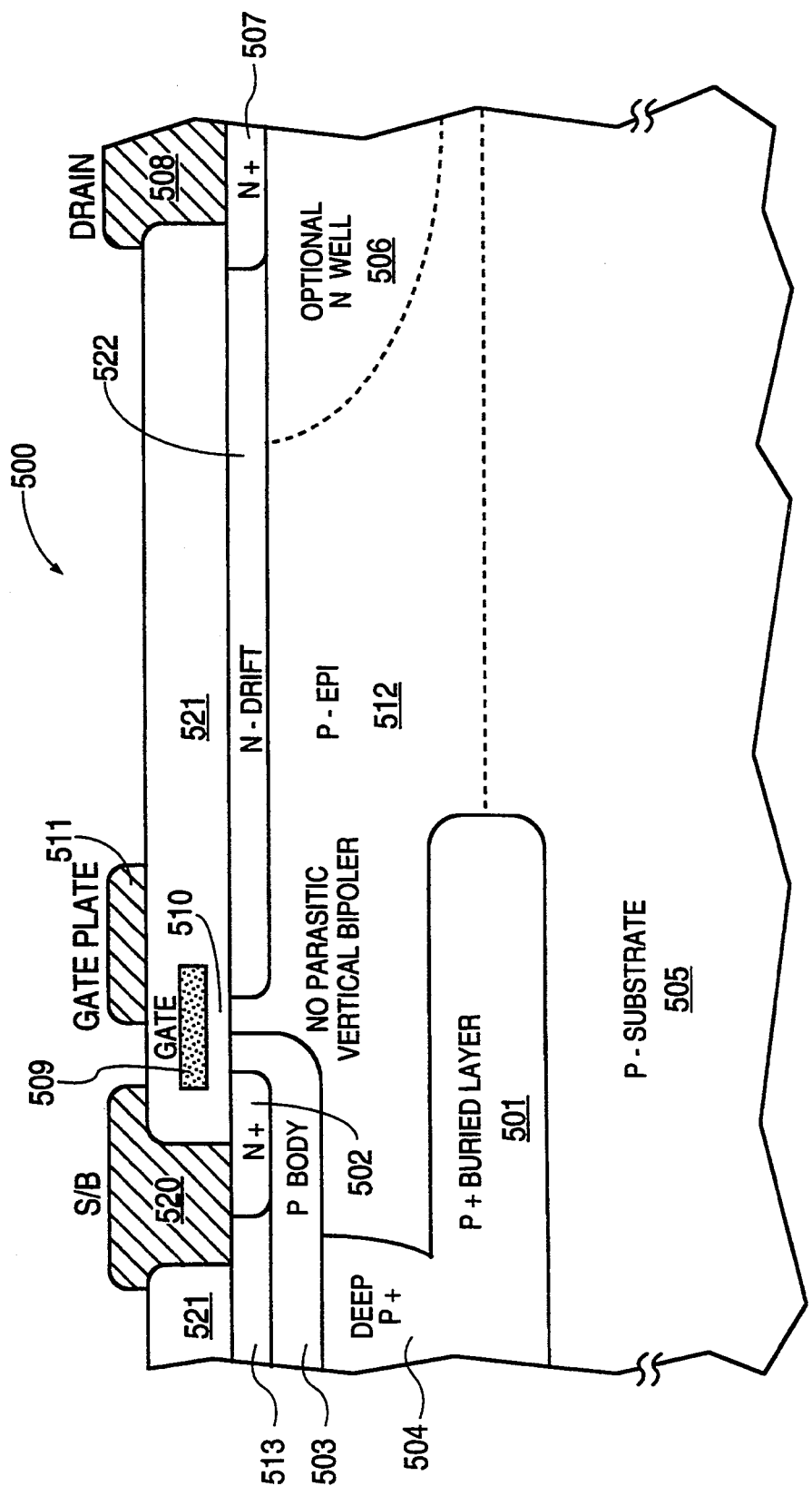
FIG. 5 shows a self-isolated LDD lateral DMOS transistor 500 with a field-shaping P+ buried layer 501, in accordance with an embodiment of the present invention.

FIG. 5 shows a cross section of an LDD lateral DMOS transistor 500 provided in accordance with one embodiment of the present invention. LDD lateral DMOS transistor 500 is a substantially annular structure in which the gate 509, the drift region 522 and the P+ buried layer 501 (see below) surround the drain region on all sides.

In this embodiment, as shown in FIG. 5, LDD lateral DMOS transistor 500 is formed in a lightly-doped P-epitaxial layer 512 on top of a P— substrate 505. The epitaxial layer 512 has a dopant (e.g. boron) concentration typically $1.0 \times 10^{14}/cm^3$ to $5.0 \times 10^{14}/cm^3$, although the dopant concentration can be as high as $8.0 \times 10^{15}/cm^3$. The depth of the epitaxial layer is chosen according to the intended operational conditions of all devices in the integrated circuit. Likewise, the resistivity of the P— (e.g. boron-doped) substrate 505 is chosen with consideration of the intended maximum operational voltage of all devices integrated with transistor 500 in the integrated circuit. For up to 500 volts, a 30–50 ohms-cm resistivity can be used. However, for higher voltage operations (e.g. 1000 volts or higher), a higher resistivity, even up to several hundred ohms-cm, can be used.

The P— epitaxial layer 512 can be deposited by high temperature chemical vapor deposition, or any other suitable technique known in the art. Before forming the P— epitaxial layer 512, the P+ buried layer 501 is formed by conventional technique, such as ion implantation, near the surface of the P— substrate 505. In the course of forming the P— epitaxial layer 512, the P+ buried layer 501 back diffuses towards the surface of the P— epitaxial layer 512. Dependent upon the number of thermal cycles in the process, an initial dopant concentration is provided such that the final dopant concentration of the P+ buried layer 501 is in the order of $10^{16}/cm^3$. In this embodiment, a $5.0 \times 10^{14}/cm^2$ implant dose of boron at 60 KeV provides the desirable final dopant concentration in the P+ buried layer 501. Since the back diffusion can be as much as 8 microns, this thickness limits the minimum depth of the P-epitaxial layer 512.

Figure 4:
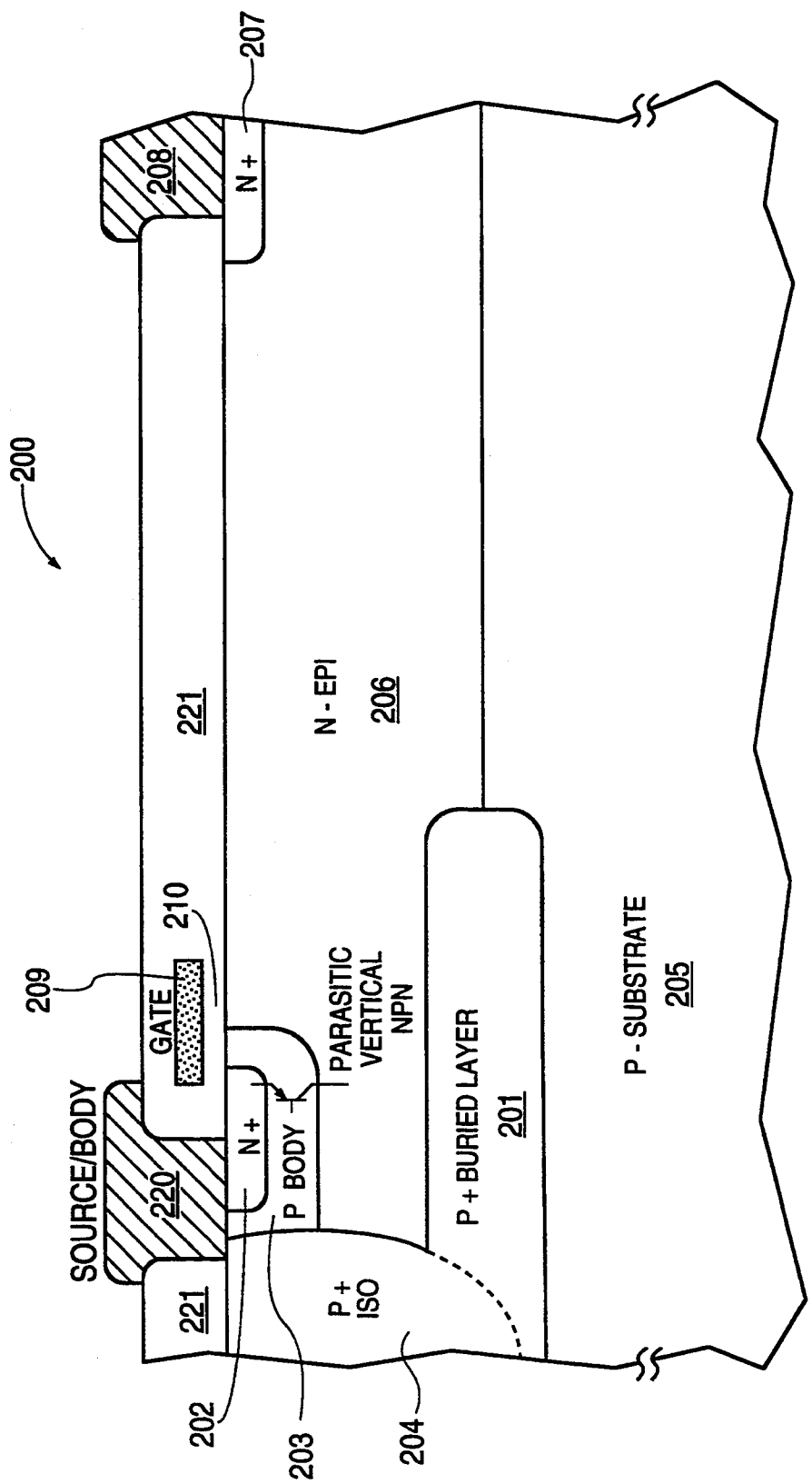
FIG. 4 shows a prior art RESURF type lateral DMOS transistor having a buried P+ layer.

FIG. 5 shows a deep P+ region 504 which, though not necessary, provides a better contact between the P-body region 503 and the P— substrate 505. If ion implantation is used to form the deep P+ region 504, a boron dose in excess of $10^{15}/cm^2$ at 60 KeV can be used. Alternatively, the P+ region 504 can be formed using a P+ predeposition from a gaseous or solid boron source. The P-body region 503 determines the threshold voltage of the LDD lateral DMOS transistor 500. The implant dose (at 60 KeV) used to form the P-body region 503 ranges from $1.0 \times 10^{13}/cm^2$ to $9.0 \times 10^{13}/cm^2$, dependent upon the desired threshold voltage, with a typical dose of $5.0 \times 10^{13}/cm^2$. The threshold voltage for common N+/P-body junction depths vary from 0.7 volts to 3.0 volts, depending on the net profile as determined by the interaction in the junction between N+ 502 and P-body region 503. In this embodiment, in the course of fabrication, the P-body region 503 down-diffuses as deep as 4 microns into the substrate. Unlike the RESURF type LDD lateral DMOS transistor, such as transistor 200 shown in FIG. 4, there is no reversed-bias junction in the vicinity of the P-body region 503. A reversed-bias junction is formed between the N+ drain 507 and the P-epitaxial layer 512, which is too far from the P-body region 503 to contribute to punchthrough breakdown degradation of the transistor 500.

The N+ source region 502 and the N+ drain region 507 are formed using conventional techniques with an implant dose of $5.0 \times 10^{15}/cm^2$ or higher. In this embodiment, 50%—50% mixture of phosphorus and arsenic is used, although either dopant can be used without the other. Because of the benefits of the present invention (explained below), the drift region 522 can be formed with a total implant dose (e.g. phosphorous) up to $4.0 \times 10^{12}/cm^2$, which is approximately four times the dopant implant dose of drift regions attainable in the prior art. The on-resistance of this transistor 500 is therefore much reduced from that of LDD lateral DMOS transistors in the prior art.

An optional N-well 506 can also be provided. When provided, N-well 506 can be 3–12 microns deep, with a dopant concentration (e.g. phosphorous) between $1.0 \times 10^{15}/cm^3$ to $2. \times 10^{16}/cm^3$. If the N-well 506 is implanted, an implant dose (e.g. phosphorous) of $3.0-8.0 \times 10^{12}/cm^2$ at 60-100 Kev can be used to provide a typical surface concentration of substantially $8.0 \times 10^{15}/cm^3$. In addition to allowing integration with P-MOS transistors, the optional N-well 506 provides additional field-shaping flexibility (explained below).

An optional P+ region 513 (e.g. boron-doped) provides a source-P-body shunt and provides better contact to the P-body region 503. If the P+ region 513 is not provided, the P-body region 503 contacts the source/body contact 520 directly, or in combination with deep P+ region 504. The gate oxide 510 and the gate 509 of transistor 500 are formed using conventional method.

Significantly, in the structure shown in FIG. 5, unlike the RESURF type lateral DMOS transistor, there is not a high-gain parasitic vertical NPN transistor susceptible to $BV_{CEO}$ snapback. The $BV_{CEO}$ snapback phenomenon is discussed above in conjunction with the RE-SURF type DMOS transistor 200 of FIG. 4. In this embodiment, there is only a parasitic lateral NPN transistor having a long base (hence, lower gain) formed by the source and drain regions 502 and 507, and the P− and P-body regions 512 and 503. Hence, transistor 500 is less likely to exhibit $BV_{CEO}$ snapback.

Figure 2:
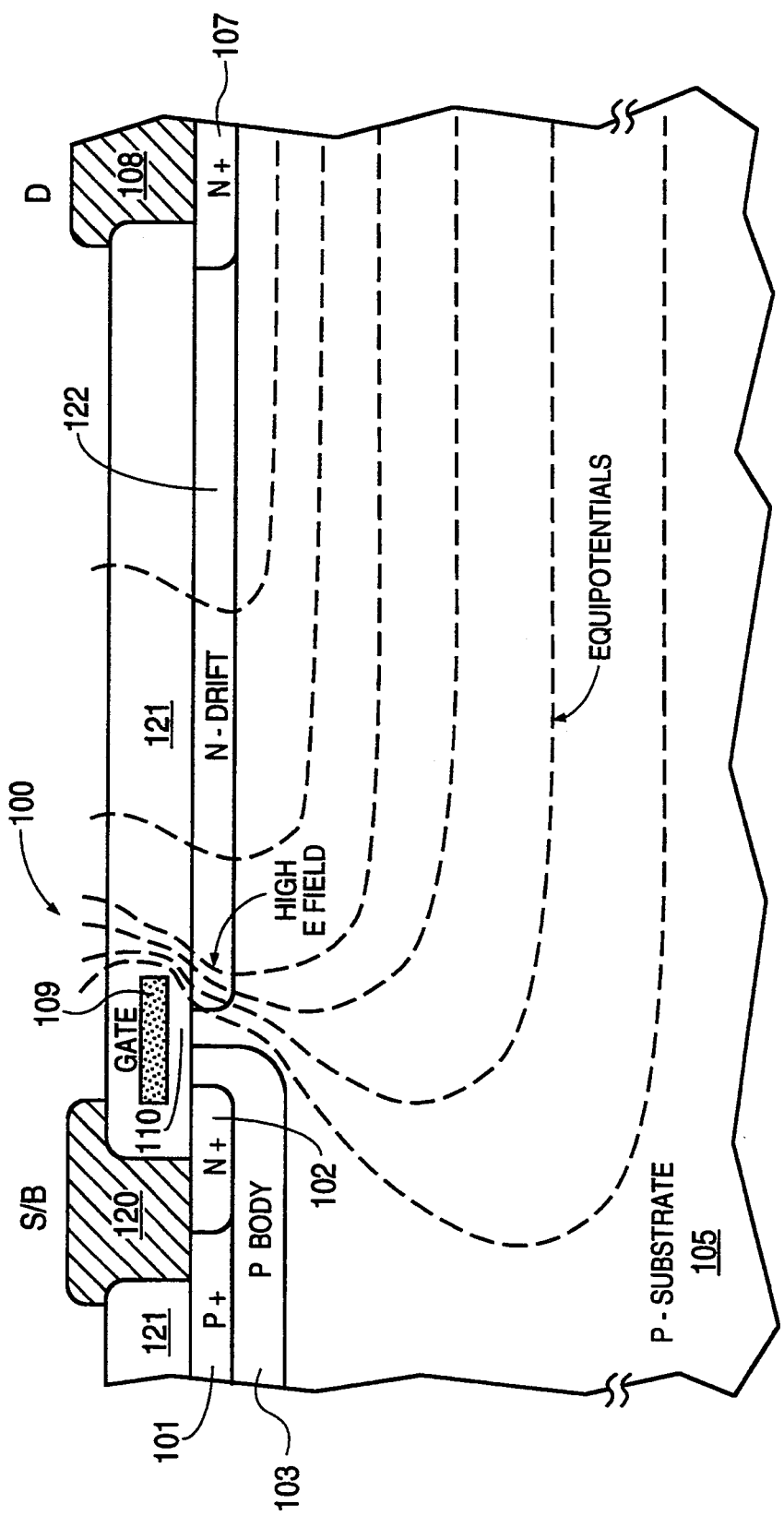
FIG. 2 shows the electrical equipotential distribution for the self-isolated LDD lateral DMOS transistor of FIG. 1.

In this embodiment, an optional gate plate 511 (e.g. aluminum) is provided for reducing the electric field crowding on the silicon surface in the manner already discussed above in conjunction with the gate plate shown in FIG. 2. Significantly, if reduction of the electric field at the drain-edge of the drift region 522 is desired, the conducting material 508 at the drain contact region 507 can also be made to extend over the insulation layer 521 beyond the drain-edge of the drift region 522 forming a field plate.

Figure 3:
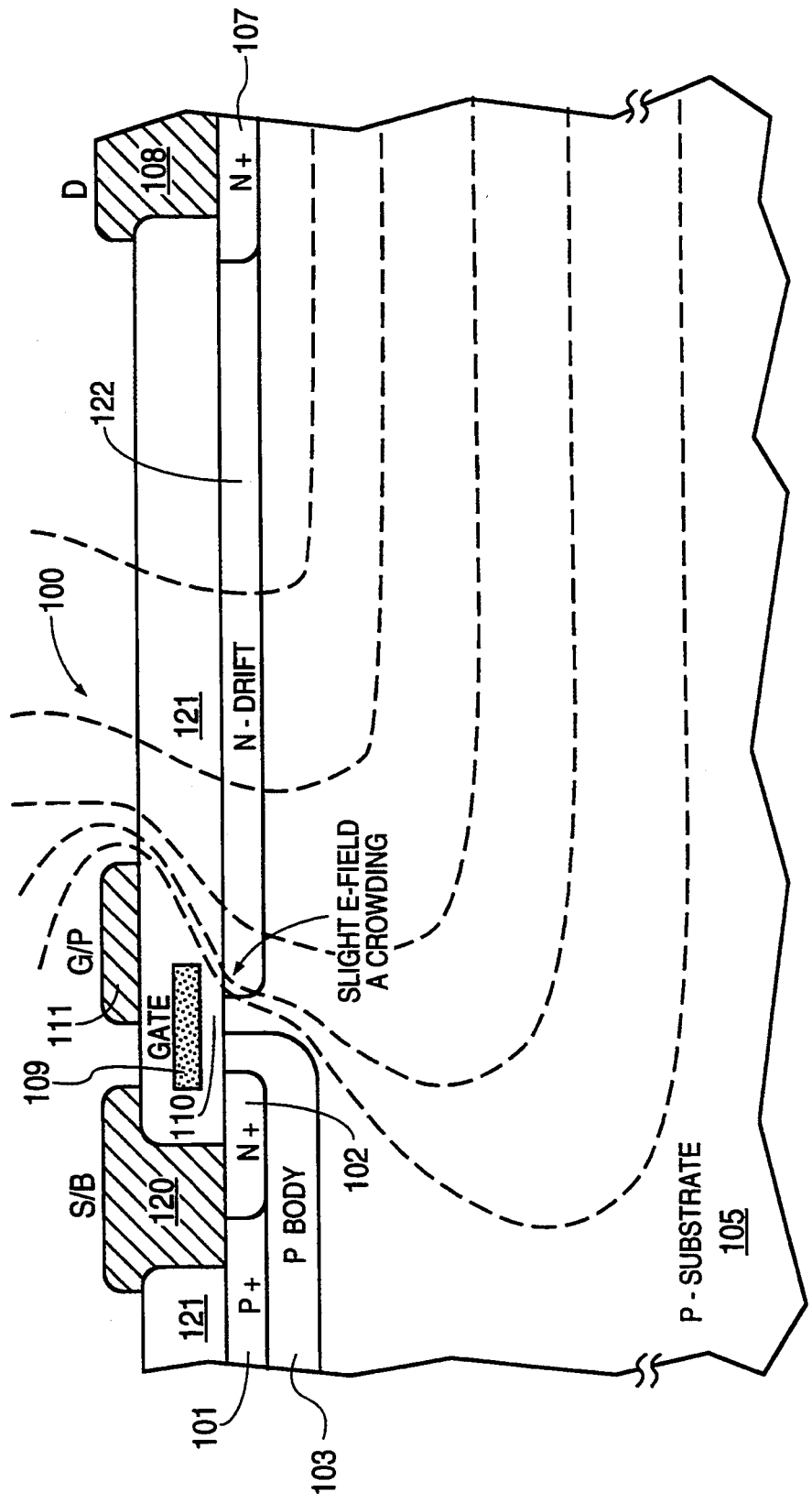
FIG. 3 shows the electrical equipotential distribution for a prior art self-isolated LDD lateral DMOS transistor having a gate plate.
Figure 6:
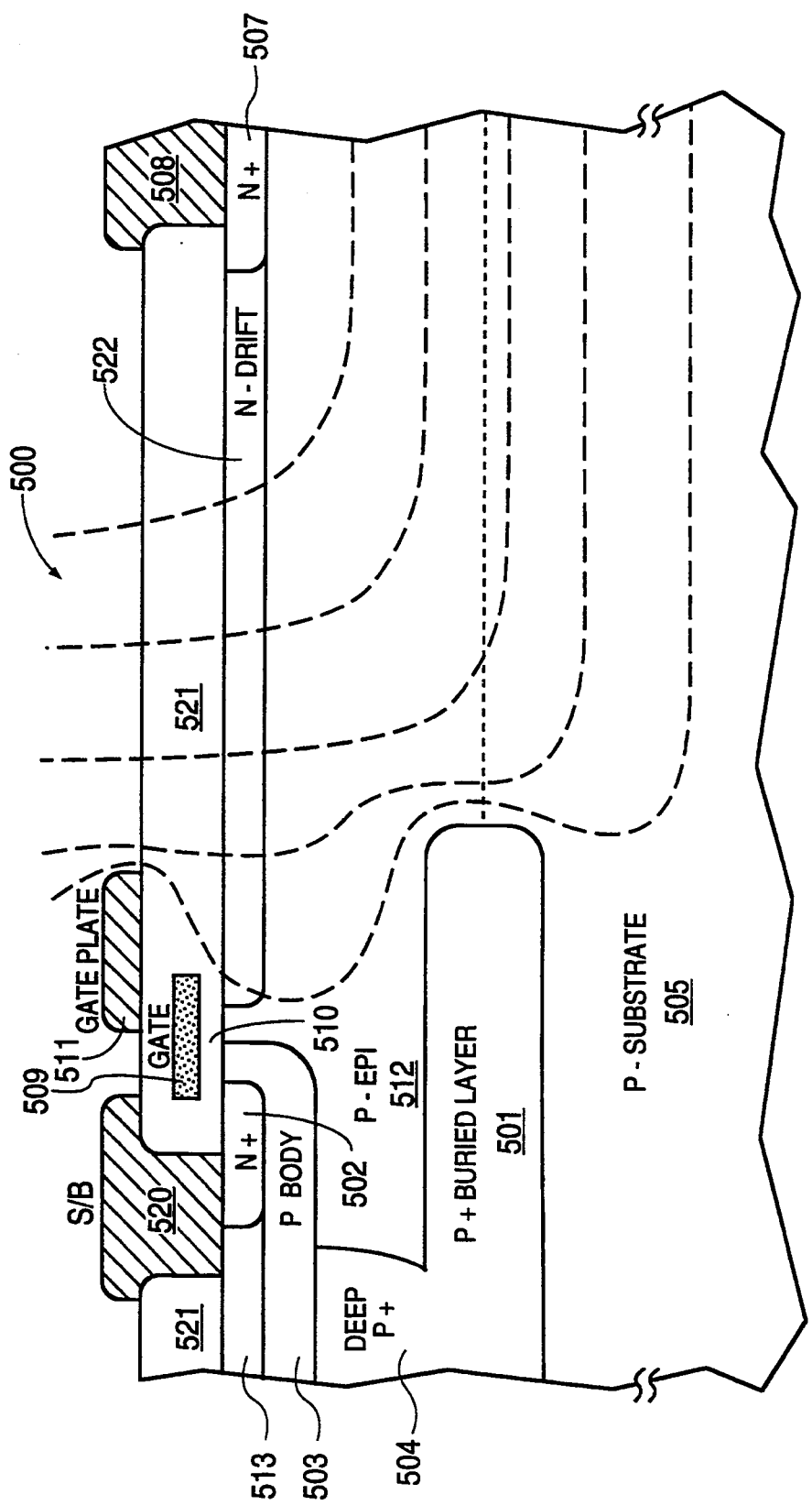
FIG. 6 shows the electrical equipotential distribution for the self-isolated LDD lateral DMOS transistor 500 of FIG. 5.

The electrical equipotential distribution of transistor 500 is shown in FIG. 6. As shown in FIG. 6, the presence of the P+ buried layer 501 pushes the electrical equipotential lines beneath the silicon surface laterally further and more evenly in the direction of the drain contact region 507. In this manner, the crowding of electrical equipotentials indicated by arrow A in FIG. 3 is relieved by the presence of P+ buried layer 501. Hence, the breakdown voltage of LDD DMOS transistor 500 is enhanced by both the reduction of the electric fields at the gate-edge of the drift region 522, and by the shifting of the electric fields into the bulk silicon away from the surface charges. Because of this breakdown voltage enhancement, the dopant concentration in the drift region 522 can be increased up to four times over the prior art, correspondingly reducing the on-resistance of the transistor 500, thereby increasing LDD lateral DMOS transistor 500's ability to sustain a higher current. Furthermore, because the breakdown remains in the bulk, the avalanche breakdown voltage remains stable, and the charging of the overlying oxide 521 is minimized.

Figure 7:
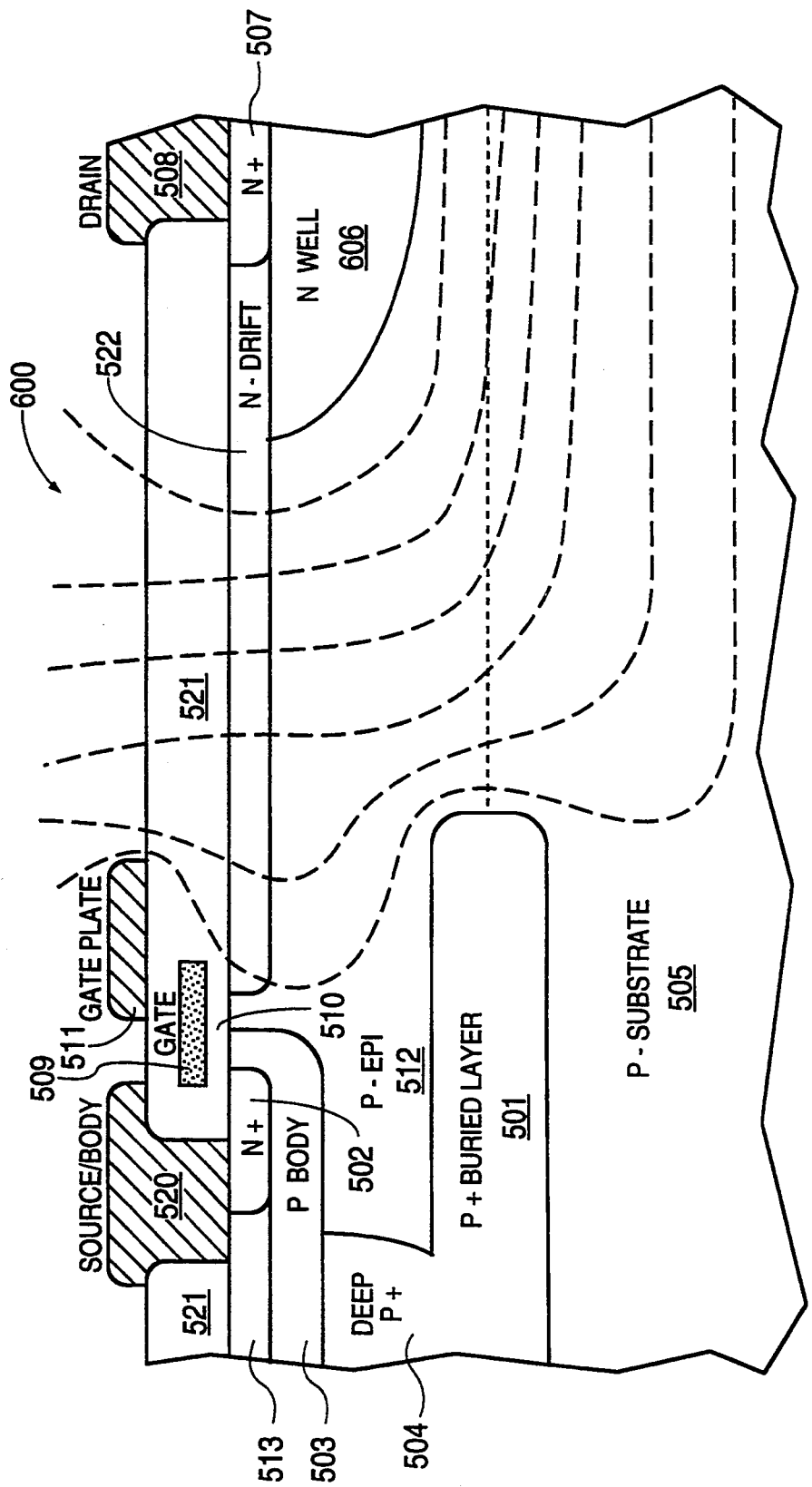
FIG. 7 shows self-isolated LDD lateral DMOS transistor 600 with an N-well 606, in accordance with another embodiment of the present invention.

FIG. 7 shows in another embodiment of the present invention the electrical equipotential distribution of an LDD lateral DMOS transistor 600 having an N-well 606. For convenience of comparison, like structures of transistors 500 and 600, respectively, of FIGS. 5 and 7 are given the same reference numerals. FIG. 7 shows that N-well 606 also pushes the electrical equipotentials of transistor 600 further into the bulk silicon and away from the surface charges. Hence, controlling the depth of N-well 606 provides further field-shaping flexibility for tailoring transistor 600 to the desired breakdown characteristics. N-wells, such as N-well 606, are commonly used for operating voltages above 200 volts, but are less commonly used if the operating voltage is less than 200 volts. This is because desirable breakdown characteristics are more easily achieved at less than 200 volts. An N-well also reduces the on-resistance of the high voltage transistors.

Figure 1:
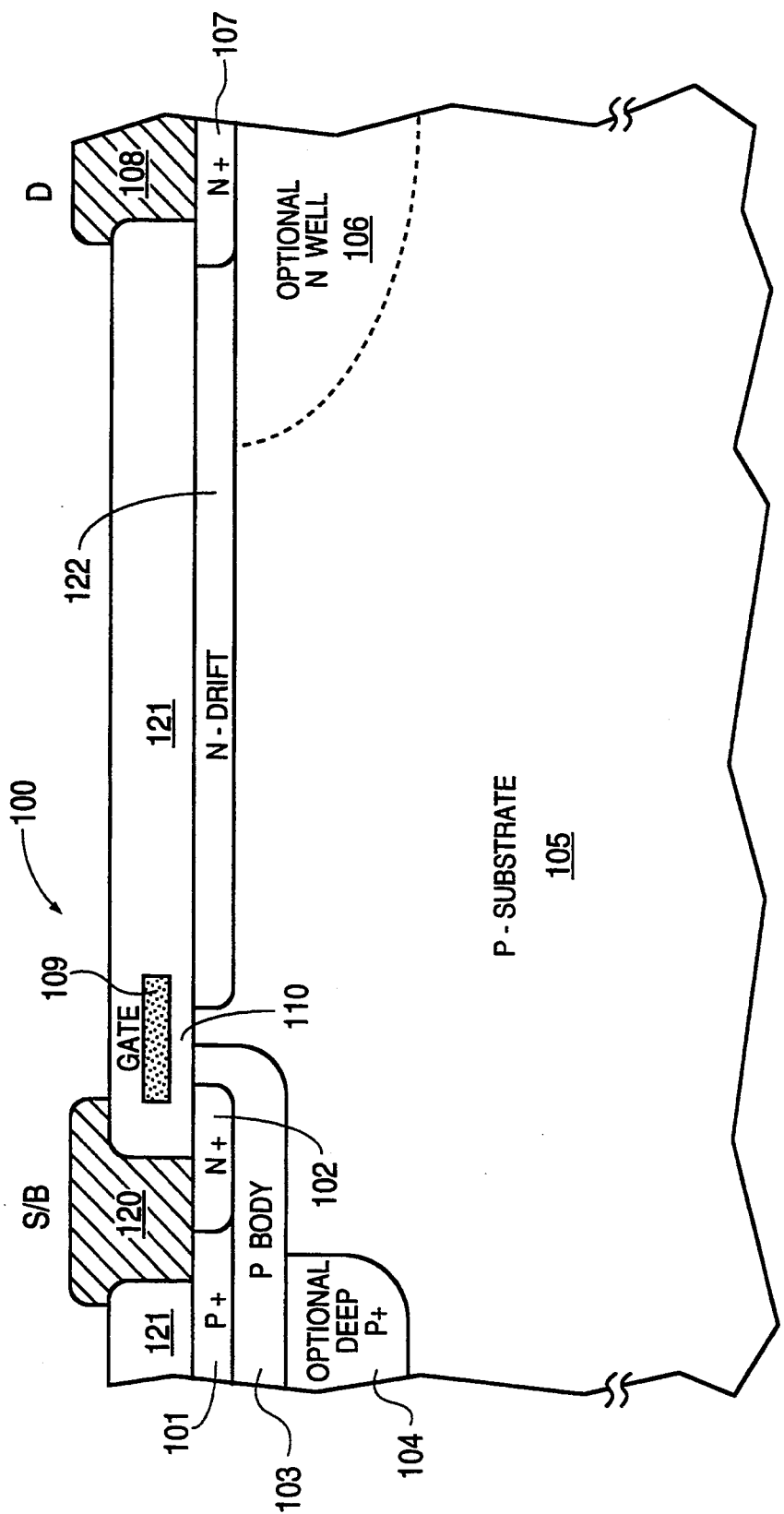
FIG. 1 shows a self-isolated LDD lateral DMOS transistor in the prior art.
Figure 8:
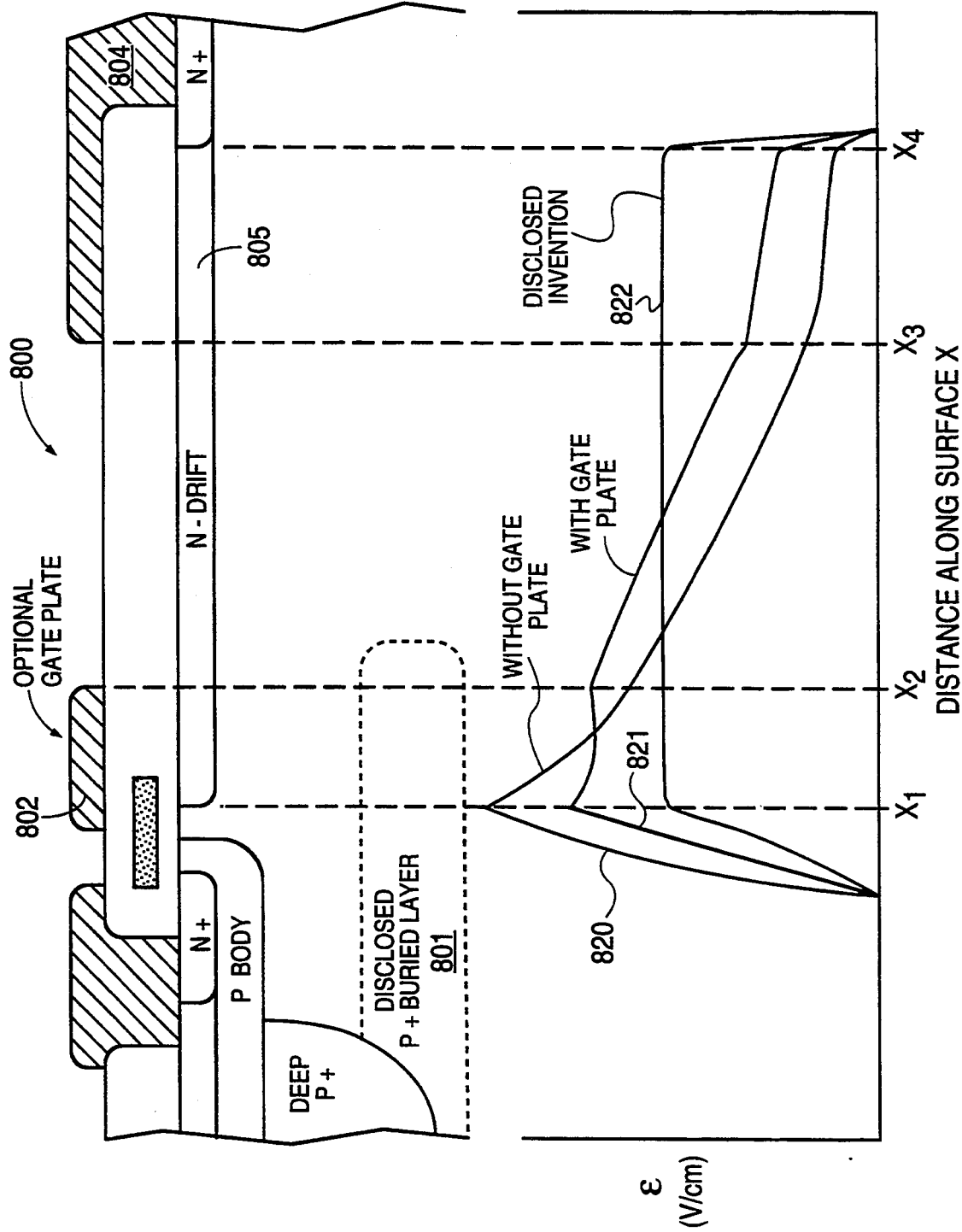
FIG. 8 compares the electric field distributions of the LDD lateral DMOS transistor of FIG. 1, the LDD lateral DMOS transistor of FIG. 2 (i.e. with a gate plate) and the LDD lateral DMOS transistor 500 of FIG. 5, provided in accordance with the present invention.

FIG. 8 compares the electric field intensities along the silicon surface of (a) an LDD lateral DMOS transistor in the prior art similar to that shown in FIG. 1; (b) an LDD lateral DMOS transistor similar to the transistor in (a), but having a gate plate such as the gate plate 802 shown; and (c) an LDD lateral DMOS transistor having a P+ buried layer, such as P+ buried layer 801 shown in accordance with the present invention. In FIG. 8, the transistor in (a) is represented by the structure 800, minus the gate plate 802 and the P+ buried layer 801; the transistor in (b) is represented by the structure 800, minus the P+ buried layer 801; and the transistor in (c) is represented by the structure 800, with both the gate plate 802 and the P+ buried layer 801. All three transistors in (a) and (b) and (c) have the drain plate 804. The drain plate 804 modifies the field distribution at the drain-edge of the drift region 805, in the manner discussed above.

In FIG. 8, the electric field intensities along the surface of the silicon is plotted against the distance in the x-direction. As shown in FIG. 8, the curves labelled 820, 821 and 822 represent respectively the electric field intensity profiles of the transistors in (a), (b) and (c) described above. It is readily seen that in all three curves 820, 821 and 822, the electric field intensity peaks at the gate-edge (point $x_1$) of the drift region 805, and approaches zero at the drain-edge (point $x_4$) of the drift region 805. As expected, the highest electric field intensity at point $x_1$ corresponds to the transistor in (a). In the transistor of (a), the electric field intensity (curve 820) rapidly falls off as the distance from the gate-edge of the drift region increases. The electric field in this instance, decreases at a rate which is moderated by the presence of the drain plate 804 between points $x_3$ and $x_4$. In the transistor of (b), the electric field intensity (curve 821) is more or less level for the region underneath the gate plate 802, and then decreases at a substantially constant rate similar to the rate of decrease shown in curve 820, as one moves beyond the extent of the gate plate 802 at point $x_2$ towards point $x_4$. As curves 820 and 821 illustrate, both the gate and the drain plates 802 and 804 have a levelling effect on the electric field intensity along the silicon surface under these plates. However, in accordance with the present invention and shown by the curve 822, transistor (c) having the P+ buried layer 801 has a substantially uniform electric field intensity profile along the entire length ($x_1$ to $x_4$) of the drift region 805.

In addition to the benefits discussed above, the P+ buried layer, such as P+ buried layer 501 of transistor 500 of FIG. 5, reduces the injected minority carrier lifetime, thereby improving the reverse-recovery characteristics in the diode formed by the drain 507, the P− epitaxial layer 512 and the P− substrate 505. Further, at the same time when the P+ buried layer 501 is formed, P+ buried layers can also be formed beneath the low-voltage NMOS transistors used to implement the circuits, such as logic circuits, integrated on the same semiconductor substrate. The buried layers under such low-voltage NMOS transistors reduce the integrated circuit's susceptibility to the CMOS latch-up condition.

Figure 9:
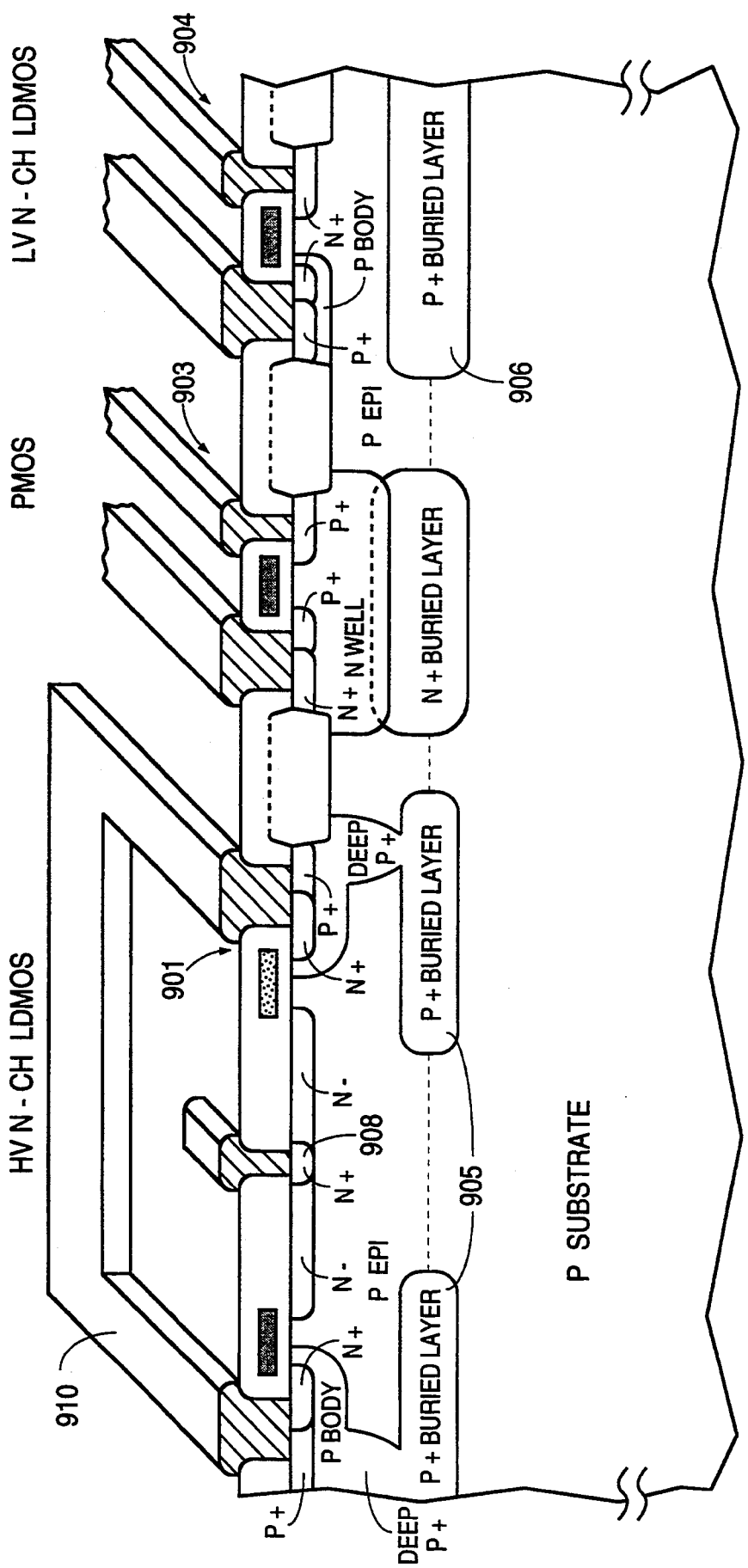
FIG. 9 shows high-voltage LDD lateral DMOS transistor 900 in accordance with the present invention integrated with low-voltage CMOS transistors 903 and 904 each using P+ and N+ buried layers to suppress the CMOS latch up phenomenon.

FIG. 9 shows an LDD lateral DMOS transistor 901 formed in an annular fashion, integrated on the same substrate as two low-voltage CMOS transistors 903 and 904. In FIG. 9, the P+ buried layers 905 and 906 serve not only as field-shaping structures for transistor 901, but also as a latch-up suppressing structure for NMOS transistor 904. Hence, from a top view, the drift, drain, P-body, the various P+ buried regions, and other structures of LDD lateral DMOS transistor 901 are annular structures. For example, as shown in FIG. 9, the conductor 910 which connects both the P-body regions and source regions of LDD lateral DMOS transistor 901 is shown in FIG. 9 as annular.

Figure 10A:
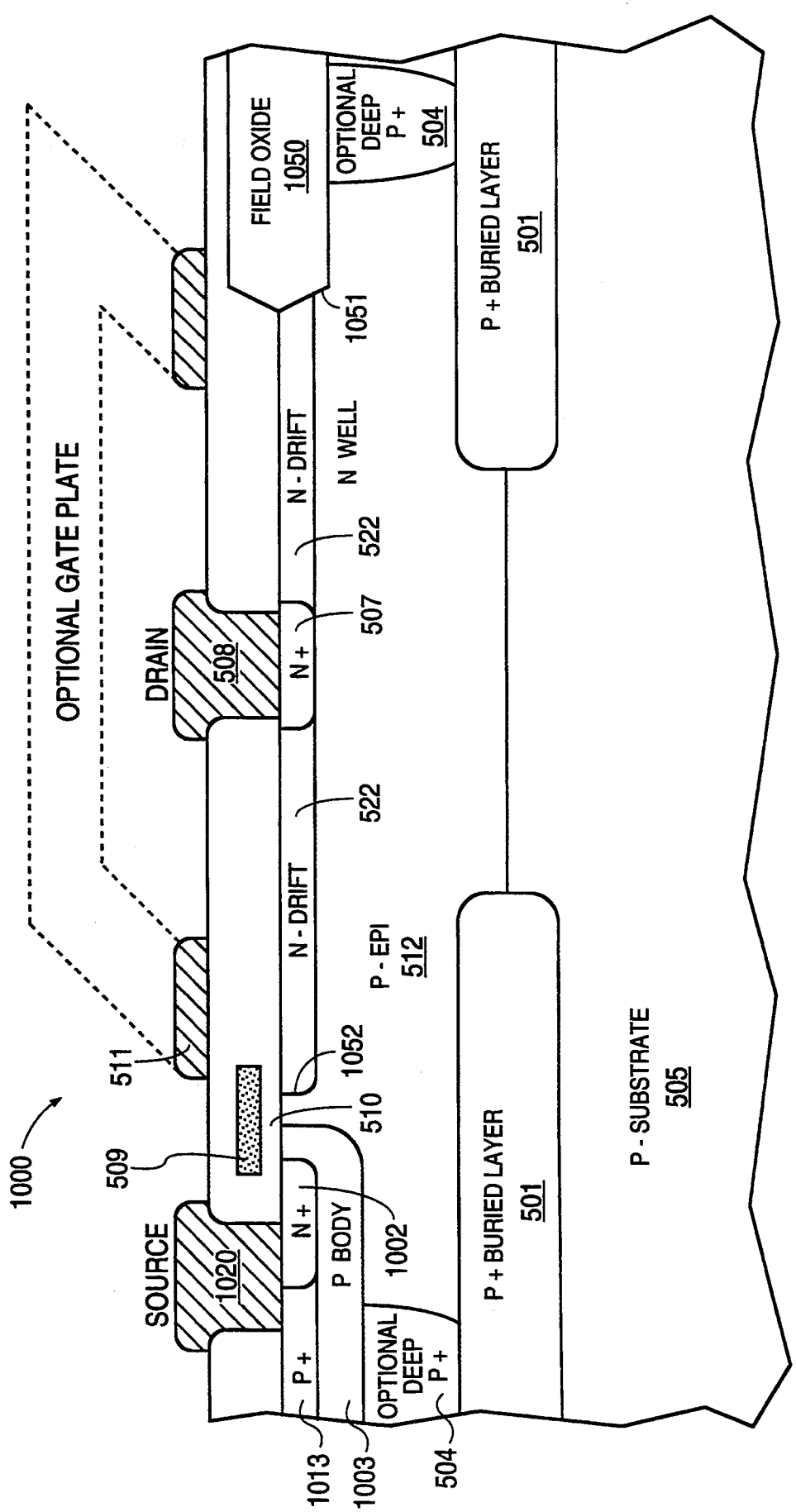
FIG. 10a is a cross section of a self-isolated LDD lateral DMOS transistor 1000 having a partial inactive edge 1051 a P+ buried layer 501 underneath the partial inactive edge, in accordance with the present invention.

FIG. 10a shows an LDD lateral DMOS transistor 1000, which is similar to transistor 500 of FIG. 5, except that in transistor 1000, only a portion of the drift region 522 borders an active channel region under the gate 1009. That is, unlike gate 509 of transistor 500, gate 1009 of transistor 1000 is not an annular structure surrounding the drain region 507. Again, for convenience of comparison, the same reference numerals in FIGS. 5 and FIGS. 10a denote structures which are functionally and structurally alike. Further, even though given different reference numerals, the source/bulk contact 1020, the P+ region 1013, and the P-body region 1003 of transistor 1000, are similar in function to corresponding source/bulk contact 502, the P+ region 513 and the P-body region 503 of transistor 500, and can be formed in substantially the same manner as described above for transistor 500.

As shown in FIG. 10a, a field oxide region 1050 is formed by a LOCOS process known in the art. This oxide region 1050, which is typically between 5000 Å to 2 microns thick, is formed prior to formation of gate 1009 and shown in FIG. 10a to abut the drift region 522 on the side of the drift region 522 away from the channel region. The interface 1051 between the drift region 522 and the field oxide region 1050 is known as the "inactive edge" and the interface 1052 between the drift region 522 and the channel region is known as the "active edge." As mentioned above, as in the gate-edge, dependent upon the resistivity of the drift region 522, an adverse high electric field may develop at the inactive edge 1051. This adverse high electric field may be further increased by the presence of P-type field dopant, or by stress-induced crystalline defects present at the interface between oxide region 1050 and the drift region 522. One source of such crystalline defects is the LOCOS field oxidation step mentioned above. Therefore, in accordance with the present invention there is provided underneath the inactive edge a portion of the P+buried layer 501. This portion of the P+ buried layer 501 pushes the electrical equipotential lines away from the inactive edge 1051 and into the bulk silicon in substantially the same manner as provided by the P+ buried layer 501 underneath the active edge 1052 described above.

Figure 10B:
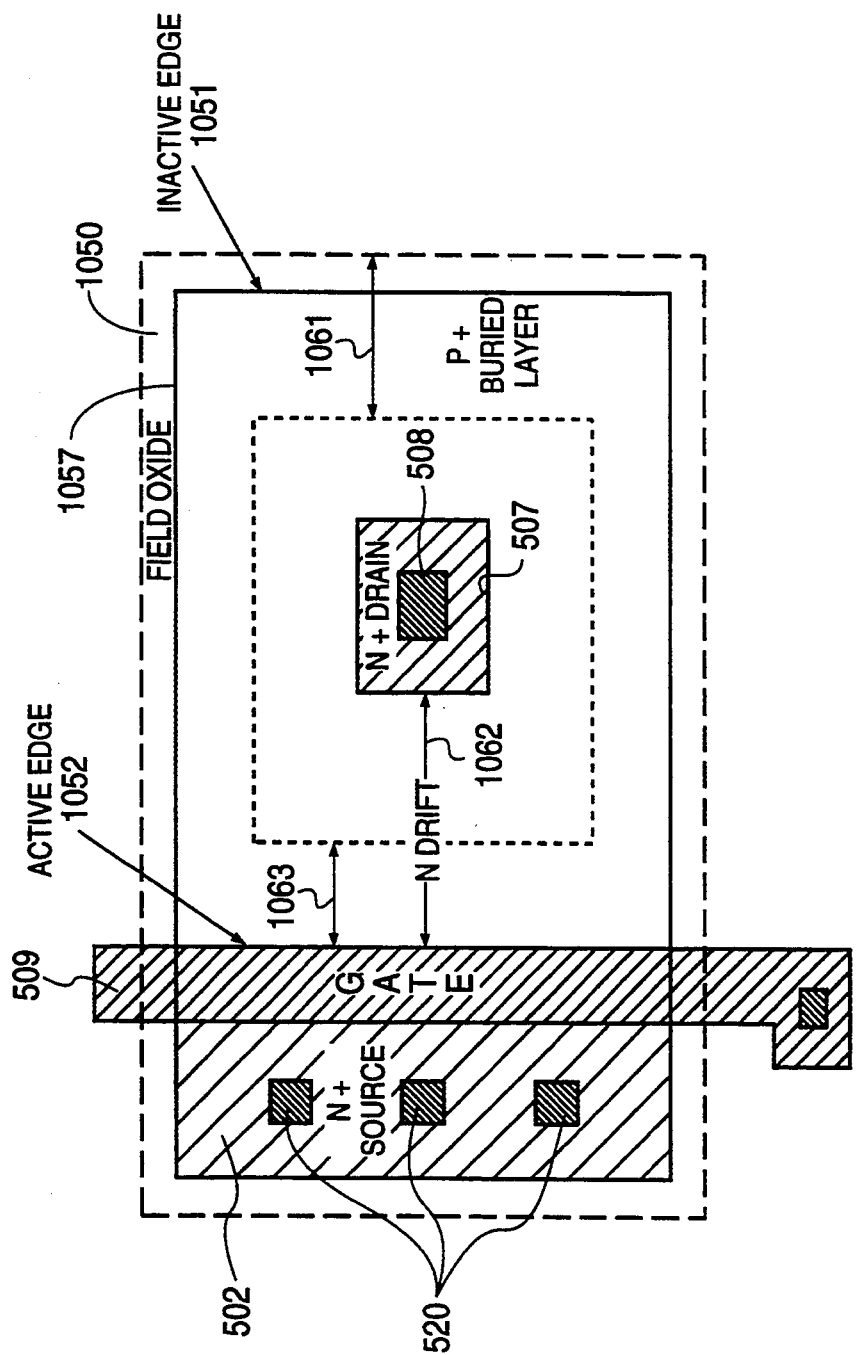

The top view of one possible layout of the transistor 1000 is shown in FIG. 10b. In FIG. 10b, the inactive edge 1051 and the active edge 1052 are shown to be on opposite sides of the drain region 507. The extent of the P+ buried layer 501, the drift region 522, and the optional gate plate 511 are indicated respectively by bidirectional arrows 1061, 1062 and 1063. Field oxide 1050 lies outside the solid rectangle, 1057. Gate 509, source/bulk contact 520, and the source region 502 are also indicated.

Figure 11:
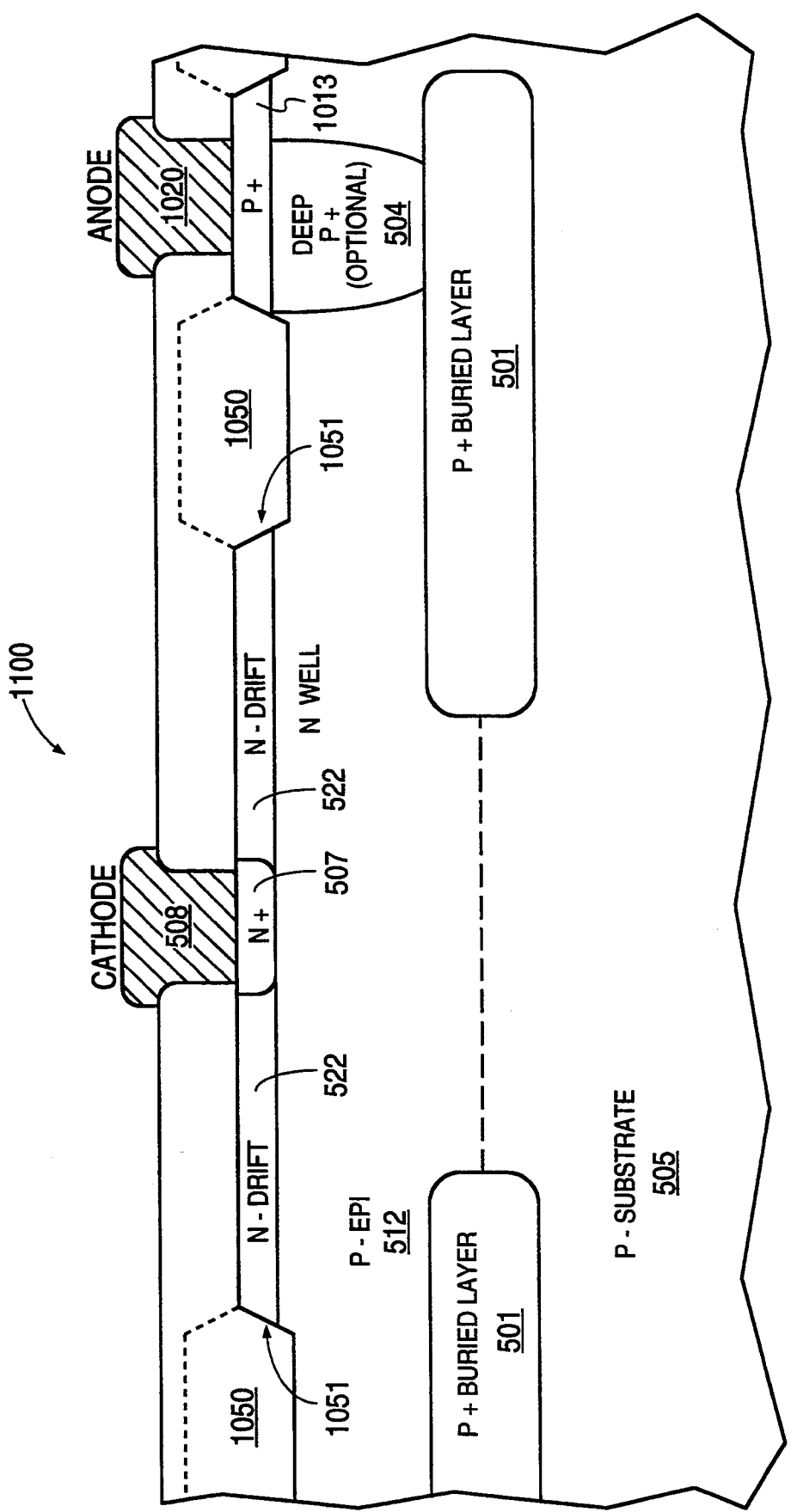
FIG. 11 is a cross section of a self-isolated LDD diode 1100 having a P+ buried layer 501 underneath a drift region 522, the drift region 522 being formed beneath a field oxide layer 1050, in accordance with the present invention.

In the technology described above, a diode structure can result from eliminating the active gate from an LDD lateral DMOS transistor, such as transistor 1000 of FIG. 10a. Such a diode is shown in FIG. 11, giving the same reference numerals to corresponding structures in Figures 10a and 11. In FIG. 11, a diode is formed by the P substrate 505 (anode), the P-epitaxial layer 512 and the drain region 507 (cathode). The P substrate layer is connected in common with the source contact 1020, and the P+ region 1013. As in transistor 1000, the P+ buried layer 501 pushes the electrical equipotential lines away from the inactive edge 1051 and into the bulk silicon to relieve high electric field that can developed at the inactive edge. In addition, as mentioned above, the P+ buried layer 501 reduces the injected minority carrier lifetime, and thereby improves the cathode-to-anode reverse-recovery characteristics of the diode.

Figure 12:
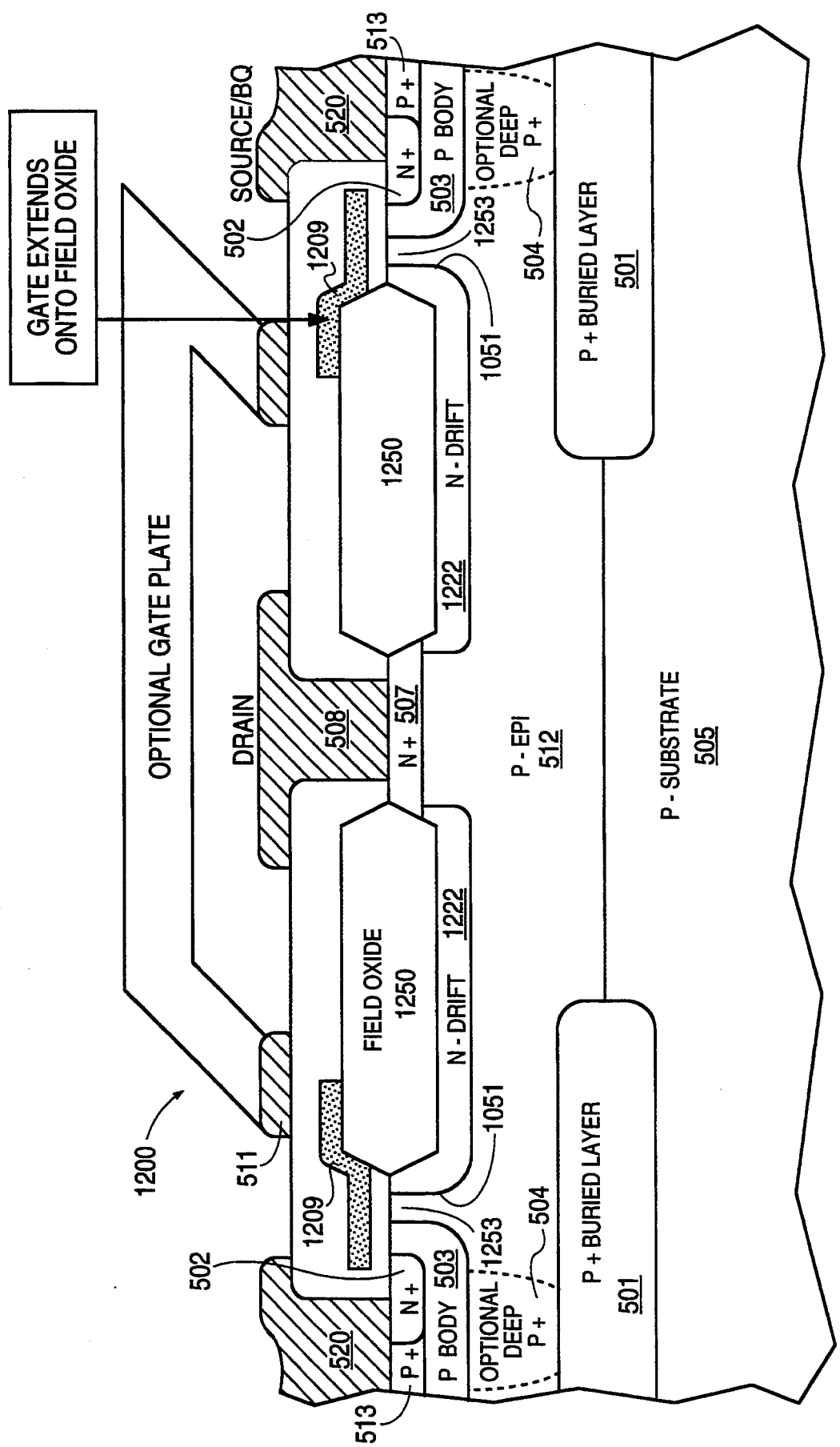
FIG. 12 is a cross section of a self-isolated LDD lateral DMOS transistor 1200 having a P+ buried layer 501 partially overlapped by the N— drift region 1222; the N-drift region 1222 being formed beneath a field oxide layer 1250, in accordance with the present invention.

FIG. 12 is another embodiment of the present invention in an LDD lateral DMOS transistor 1200, in which a field oxide region 1250 is formed over the drift region 1222. Like transistor 500 of FIG. 5, transistor 1200 is a substantially annular structure having gate 1209, drift region 1222, and the P+ buried layer 501 surround the drain region 507. Again, for the convenience of comparison, like structures of the transistors 500 and 1200 (FIGS. 5 and 12) are given the same reference numerals. The like structures of transistors 500 and 1200 can be formed in substantially the same manner as described above for transistor 500. In addition, the drift region 1222 can be formed in the same manner as the drift region 522 of transistor 500. Of significance in transistor 1200 is the field oxide layer 1250 not found in transistor 500 of FIG. 5. This field oxide region 1250, which may be formed by the LOCOS process mentioned above, is distinguished from other available oxide layers in that it can be any thick oxide formed prior to the formation of gate 1209, thereby allowing an overlap of the gate 1209 to be formed over part of the field oxide 1250, as shown in FIG. 12. This overlap by the gate 509 over the field oxide 1250 forms an effective gate plate to prevent high electric field at the interface 1251 between the channel region 1253 and the drift region 1222, thereby further enhancing the breakdown voltage of transistor 1200.

INTERACTION WITH OVERLYING LAYERS

One problem faced by high voltage integrated circuits is build up of charge on overlying layers, such as a passivation layer. The charge on the passivation layer changes the electric field in the underlying silicon, and may change the effective charge in a lightly doped region.

Charge on the passivation layer typically comes from the integrated circuit itself or from the surroundings, for example through or from plastic packaging. In most high volume semiconductor products, plastic packaging is preferred over the higher cost ceramic packaging. Unfortunately, plastic is a relatively porous material that allows moisture and charged ions to pass through. Charged ions can also be present in the plastic at the time of formation. Charged ions become trapped on the surface of the passivation layer in an amount that depends on the operating environment of the integrated circuit. Because the operating environment of integrated circuits varies, the amount of charge present is difficult to predict.

Figure 13:
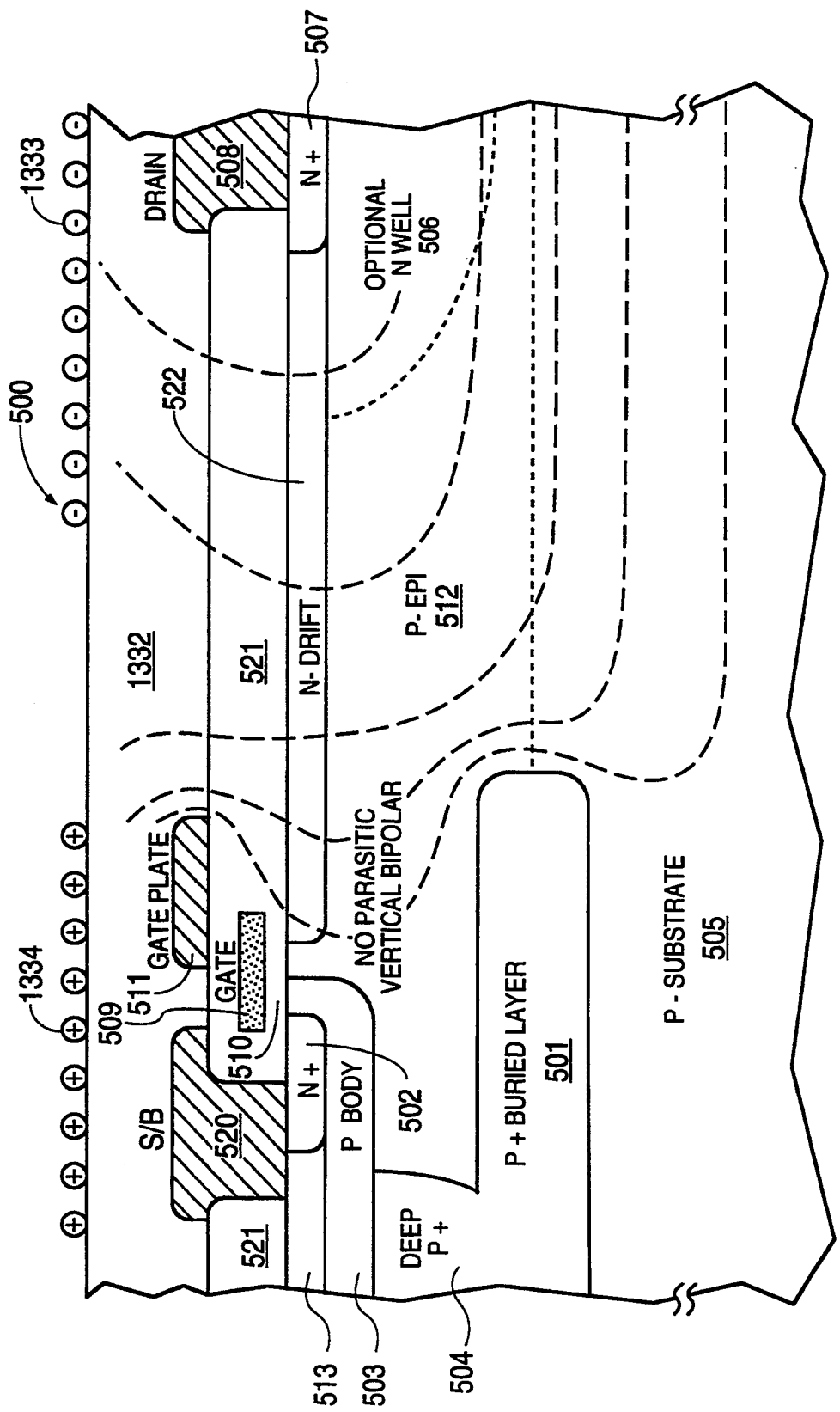
FIG. 13 shows the self-isolated LDD lateral DMOS transistor 500 with an insulating passivation layer and electrical equipotential distribution that results from a charge build up on the surface of the passivation layer.

FIG. 13 shows equipotentials that result when there is a charge 1333 and 1334 on an insulating passivation layer 1332 overlying an N-channel LDD lateral DMOS transistor 500. Insulating passivation layers are well known in the art, and typically made of materials such as silicon nitride or oxynitride. The amount of charge 1333 and 1334 varies depending on the operating environment and the time of operation of the transistor 500. The field lines drawn in FIG. 13 are illustrative. The actual equipotential lines depend on the amount of charge 1333 and 1334.

When the transistor 500 is in operation, charge on the passivation layer 1332 migrates, causing net negative charge 1333 to accumulate above the drain region 507, drain contact 508, and the N− drift region 522, i.e. the portions of the integrated circuit having the highest voltage. Net positive charge 1324 accumulates over the source region 502, contact 520, and gate 509, i.e. regions of the circuit having the lowest voltage.

The charges 1333 and 1334 concentrate the equipotentials and increase the strength of the electric field near the regions of highest and lowest voltages. In particular, the electric field is stronger near the edge of the gate 509 than would be the case without charges 1333 and 1334, and the breakdown voltage is lowered. The effect is similar to a change in the dopant dose in the drift region 522, and may be treated as an effective change in charge in the drift region 522 when the transistor is in the off state.

The transistor 500 must be designed with tolerance for an expected range of charge 1333 and 1334 on overlying layers and for an expected change in breakdown voltage. However, if the charge exceeds the expected amount, the integrated circuit may fail. In a typical transistor with a maximum breakdown voltage of 600 V and an insulating passivation layer, charge build up on the passivation layer can lower the breakdown voltage by up to about 300 V.

To overcome the problem of charge build up, a layer of semi-insulating polycrystalline oxygen doped silicon (SIPOS) may be place in electrical contact with underlying active circuit elements. SIPOS is sufficiently conductive that a measurable current flows between the active elements on the integrated circuit through the SIPOS layer. The effect of the current flow through the SIPOS layer establishes a voltage distribution in the SIPOS layer. The voltage distribution dominates the effects of charge build up on layers overlying the SIPOS layer and provides a predictable electric field in the underlying regions. Further, any ion that comes in contact with the SIPOS layer is neutralized by flow of charge to and from the underlying active circuit elements.

There are at least two problems with using a current flow through a SIPOS layer to avoid the effects of charge build up on the surface of a passivation layer. One is the continuous current flow through the resistive SIPOS layer wastes power. The other is the current in a SIPOS layer may not match high speed switching, because SIPOS layers generally have a large RC time constant. When the underlying circuit element switches voltage, the current and voltage distribution in the SIPOS layer does not change as quickly. Accordingly, the voltages in the SIPOS layer may increase critical electric fields in the underlying circuit elements and cause a breakdown.

Figure 14:
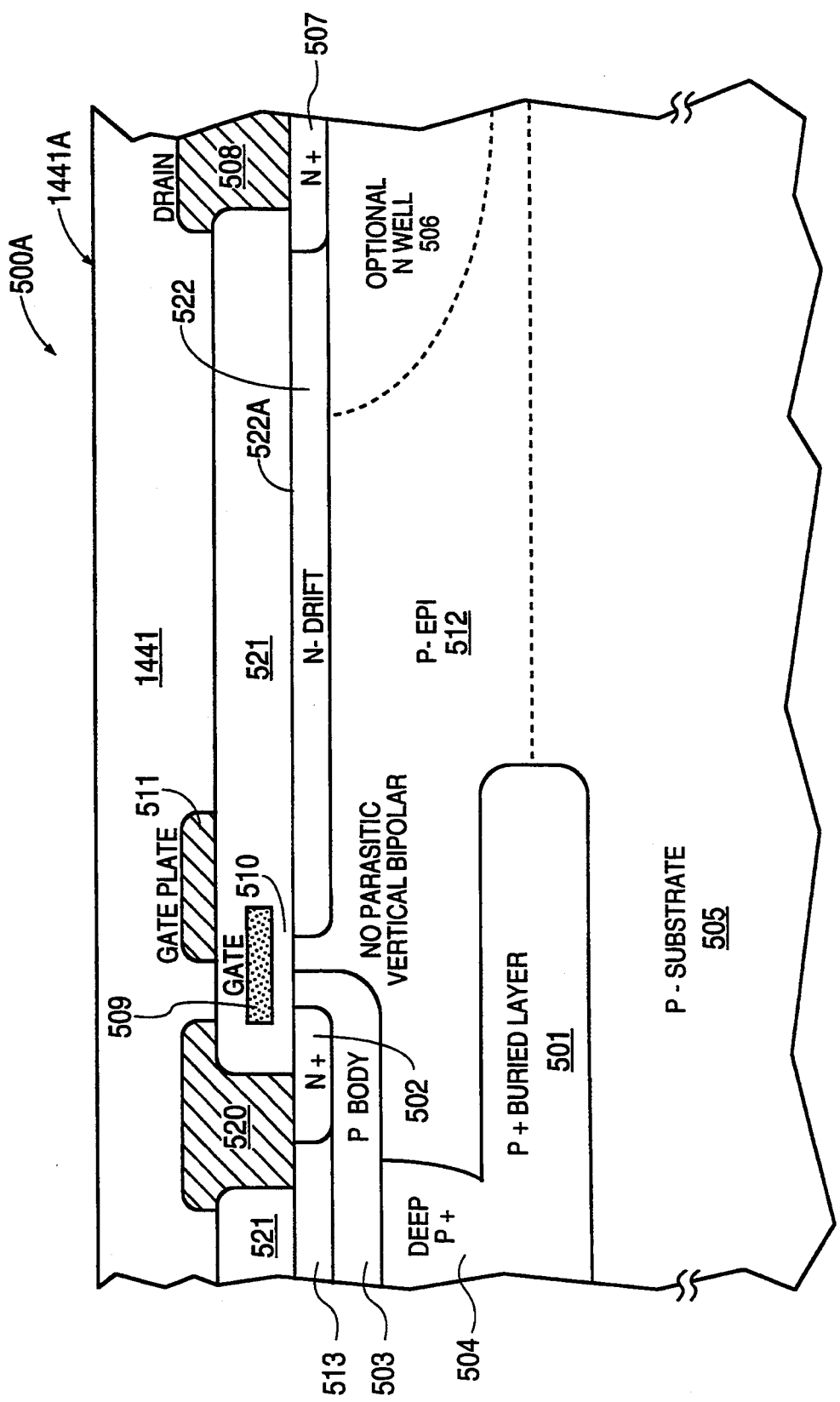
FIG. 14 shows the self-isolated LDD lateral DMOS transistor 500A with a silicon-enriched nitride passivation layer 1441, in accordance with an embodiment of the present invention.

FIG. 14 shows an embodiment of the invention that employs a layer 1441 which is formed from silicon rich nitride, also referred to herein as Semi-insulating Silicon Nitride (SinSiN). The SinSiN layer 1441 operates both as a protective hermetic seal for the integrated circuit and as a structure to prevent charge build up. The SinSiN layer 1441 is preferably only slightly conductive, although the conductivity varies considerably with temperature and electric field. At 75° C., a typical SinSiN layer has a conductivity in the range from about $10^{-8}$ Ω·cm to about $10^{-12}$ Ω·cm with a typical value of about $10^{-10}$ Ω·cm, so that current flow between the source contact 520 and the drain contact 508 through the SinSiN layer 1441 is negligible.

It is believed that the conductivity of a SinSiN layer such as layer 1441 depends on an applied electric field in a highly non-linear manner. In strong electric fields, the SinSiN layer 1441 becomes much more conductive. If for example, a negative charge builds up on surface 1441A of the SinSiN layer 1441 near high voltage areas such as drain contact 508, the electric field near the charge strengthens and the SinSiN layer 1441 becomes conductive enough that the charge flows to the drain contact 508. Charge on surface of the SinSiN layer 1441 is thereby neutralized and prevented from increasing beyond a fixed level.

In the transistor 500A, the SinSiN layer 1441 effects electric fields throughout the layers of the transistor 500A, and all regions in the transistor 500A interact to shape the electric field and determine the breakdown voltage of the transistor 500A. In particular, the SinSiN layer 1441, the gate plate 511, the geometry and dopant dose in the N- drift region 522, and the geometry of the P+ buried layer 501 cooperate to control the electric field and the breakdown voltage. The relationship between the SinSiN layer 1441 and drift region 522 is especially critical. With the SinSiN layer 1441, the problem of changes in the effective charge of the drift region 522 is decreased. Accordingly, the effective charge dose in the drift region is dependably known regardless of the operating environment. The transistor 500A may be optimized to have minimum on-resistance or optimized to operate over broad temperature variations without the need to incorporate tolerance for large variation in charge on the passivation layer.

In one embodiment of the transistor 500A, the distance between drain contact 508 and gate 509 is 60 μm. The P+ buried layer 501 extends 15 μm past gate 509, is form 15 μm beneath the surface 522A with a dopant dose of $5 \times 10^{13}$/cm². Through thermal processes, measurable concentrations of dopant from the buried region diffuse to with 3 to 4 μm of the surface 522A. The drift region 522 typically has a dopant dose as high as $1.5 \times 10^{12}$/cm², but can also have a dopant dose of $1.2 \times 10^{12}$/cm². The SinSiN layer 1441 has an index of refraction of about 2.4, is 8000 Å thick, and is 1.1 μm above the surface 522A. This embodiment has a maximum breakdown voltage of approximately 600 V and the change in breakdown voltage caused by charge build up is limited to less than about 30 V.

The SinSiN layer may be formed using known plasma enhanced chemical vapor deposition (PECVD), for example, using commercially available equipment, ASM Plasma 3, with a gas flow of 0.64 liters per minute (1 pm) of silane $SiH_4$ and 2.8 lpm of ammonia $NH_3$ at 2 torr and a power setting of 1.2 kW.

Although, the silicon rich nitride layer 1441 is shown in relation to a transistor 500A, a silicon rich passivation layer may also be employed with other devices having drift regions and buried layers, such as the diode 1100 shown in FIG. 11.

Figure 15:
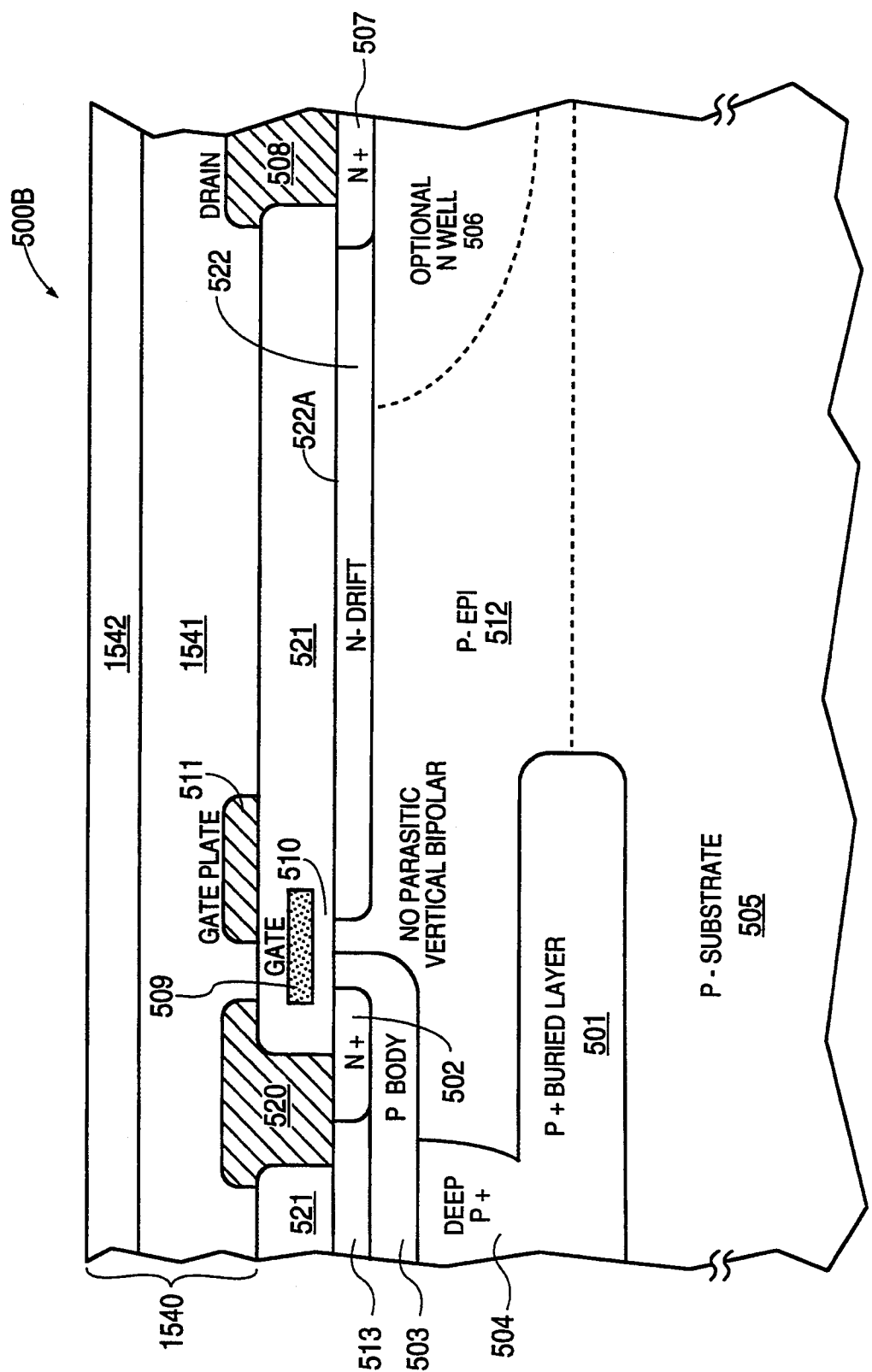
FIG. 15 shows the self-isolated LDD lateral DMOS transistor 500B with a multiple layer passivation structure, in accordance with an embodiment of the present invention.

FIG. 15 shows a multiple-layer passivation structure 1540, comprised of layer 1541 and layer 1542, which provides a hermetic seal for the wafer as well as an electric shield. The passivation structure includes a layer 1541 formed from a material such as SinSiN formed 8000 Å thick as described above, and an insulating layer 1542 made from a material such as silicon nitride $Si_3N_4$ deposited 2000 Å thick over the layer 1541. Using PECVD processes, both layers 1541 and 1542 may be deposited during the same process by changing the chemical composition of the in flowing gases during the deposition.

The layer 1541 shields the underlying circuit elements from charge on the surface of the layer 1542 by drawing from the contacts 508 and 520 an image charge which neutralizes the surface charge on 1542.

FIG. 15 also illustrates that the passivation structure 1540 may be multi-layered, two or more layers, where each layer has a different conductivity and the combination of layers together with the underlying active elements shape the electric field in the integrated circuit.

The above detailed description and the accompanying drawings are intended to illustrate the specific embodiments of the present invention and not intended to limit the present invention. Various modifications and variations within the scope of the present invention are possible. For example, it is within the ability of one of ordinary skill to provide P-channel analog of the N-channel LDD lateral DMOS transistors 500, 500A, or 500B, by reversing the conductivity of all the relevant semiconductor regions. As another example, it is also known that the P+ body contact region 513 and the N+ contact region 502 may be separated electrically, allowing a low voltage reversed bias of a few volts to be impressed across the source-to-body junction without significantly altering the conduction or breakdown characteristics of the device. Such modification is within the scope of the present invention. The scope of the present invention is defined by the following claims.

We claim:

1. A field effect transistor, comprising:
   a substrate of a first conductivity type;
   an epitaxial layer of the first conductivity type formed on the substrate;
   a first region of a second conductivity type formed in the epitaxial layer;
   a second region of the second conductivity formed in the epitaxial layer, the second region being separated from the first region;
   a drift region of the second conductivity formed in the epitaxial layer between the first region and the second region, the drift region being in contact with the second region;
   a channel region in the epitaxial layer between the drift region and the first region;
   an insulating layer overlying the epitaxial layer;
   a gate region overlying the insulating layer and the channel region; and
   a passivation layer made of silicon rich nitride formed overlying the insulating layer, the passivation layer being electrically connected to the first region and the second region,
   wherein an electric field forms in the drift region and the channel region when the first region is at a first voltage and the second region is at a second voltage.

2. The transistor of claim 1, further comprising a buried layer of the first conductivity, the buried layer being formed on the substrate and having a portion located underneath the channel region and the drift region so that a voltage of the buried layer helps shape the electric field in the drift region and channel region.

3. The transistor of claim 2, wherein the silicon rich nitride has a conductivity such that no significant current flows between the first and the second region through the passivation layer, but if charge builds up on passivation layer current flows from one of the first and the second regions to neutralize the charge on the passivation layer before the charge significantly changes the electric field in the drift region.

4. The transistor of claim 2, wherein the silicon rich nitride passivation layer comprises:
   a first passivation layer formed in electrical contact with the first and second regions; and
   a second passivation layer formed overlying the first passivation layer, wherein the first and second passivation layers have different conductivities.

5. The transistor of claim 2, wherein the silicon rich nitride passivation layer comprises a plurality of layers, each layer having a conductivity which is different from the conductivity of an adjacent layer.

6. The transistor of claim 2, further comprising a deep well of the first conductivity which electrically connects the first region and the buried layer.

7. The transistor of claim 2 further comprising a conducting plate located above the gate region and extending over an interface between the channel region and the drift region.

8. The transistor of claim 1, wherein the transistor is a DMOS transistor which further comprises a body region of the first conductivity type formed in the epitaxial layer and having a dopant concentration higher than the epitaxial layer, the body region underlying the first region and extending laterally beyond the first region in between the first region and the drift region.

9. The DMOS transistor of claim 8, further comprising a buried layer of the first conductivity, the buried layer being formed on the substrate and having a portion located underneath the channel region and the drift region so that a voltage of the buried layer helps shape the electric field in the drift region and channel region.

10. The DMOS transistor of claim 9, wherein the silicon rich nitride has a conductivity such that no significant current flows between the first and the second region through the passivation layer, but if charge builds up on passivation layer current flows from one of the first and the second regions to neutralize the charge on the passivation layer before the charge significantly changes the electric field in the drift region.

11. A diode, comprising:
   a substrate of a first conductivity type;
   an epitaxial layer of the first conductivity type formed on the substrate;
   a first region of the first conductivity type formed in the epitaxial layer;
   a second region of a second conductivity type formed in the epitaxial layer, the second region being separated from the first region;
   a drift region of the second conductivity formed in the epitaxial layer between the first region and the second region, the drift region being in contact with the second region;
   a channel region in the epitaxial layer between the drift region and the first region;

an insulating layer overlying the epitaxial layer; and a passivation layer made of silicon rich nitride formed overlying the insulating layer, the passivation layer being electrically connected to the first region and the second region, wherein an electric field forms in the drift region and the channel region when the first region is at a first voltage and the second region is at a second voltage.

12. The diode of claim 11, further comprising a buried layer of the first conductivity, the buried layer being formed on the substrate and having a portion located underneath the channel region and the drift region so that a voltage of the buried layer helps shape the electric field in the drift region and channel region.

13. The transistor of claim 12, wherein the silicon rich nitride has a conductivity such that no significant current flows between the first and the second region through the passivation layer, but if charge builds up on passivation layer current flows from one of the first and the second regions to neutralize the charge on the passivation layer before the charge significantly changes the electric field in the drift region.

14. The diode of claim 13, further comprising a body region of the first conductivity type formed in the epitaxial layer and having a dopant concentration higher than the epitaxial layer, the body region underlying the first region and extending laterally beyond the first region in between the first region and the drift region, whereby the diode is a DMOS structure.

* * * * *